United States Patent [19]

Walton

[11] 4,157,481
[45] Jun. 5, 1979

[54] INTEGRAL CYCLE SWITCH SYNCHRONIZED TO AXIS-CROSSING

[75] Inventor: John F. Walton, McLean, Va.

[73] Assignee: Pace, Inc., Silver Spring, Md.

[21] Appl. No.: 817,050

[22] Filed: Jul. 19, 1977

[51] Int. Cl.$^2$ .......................................... H03K 17/72
[52] U.S. Cl. ......................... 307/252 B; 307/252 N; 307/252 UA; 307/311; 323/18; 323/24
[58] Field of Search ........ 307/252 B, 252 N, 252 UA, 307/311; 323/18, 24

[56] References Cited

U.S. PATENT DOCUMENTS

| | | | |
|---|---|---|---|
| 3,569,999 | 3/1971 | Pascente | 307/252 B |
| 3,668,422 | 6/1972 | Pascente | 307/252 B |
| 3,708,696 | 1/1973 | Lorenz | 307/252 B |
| 3,917,962 | 11/1975 | Pascente | 307/252 B |

*Primary Examiner*—John Zazworsky
*Attorney, Agent, or Firm*—Fidelman, Wolffe & Waldron

[57] ABSTRACT

A switching circuit is comprised of a triac in series with the electrical load across an AC power source. The triac commences to conduct only after a unidirectional, gate-controlled SCR is conducting. Conduction of the SCR drives the gate of the triac enabling conduction. In turn, the SCR is controlled by a circuit network which regulates the potential at the SCR gate and is responsive to an external device which may be a photodetector and movable shutter in combination with a light-emitting diode (LED). Load conduction commences in synchronism with the source voltage crossing of the reference axis in a selected direction. When the load is turned off, an integral cycle is provided.

25 Claims, 4 Drawing Figures

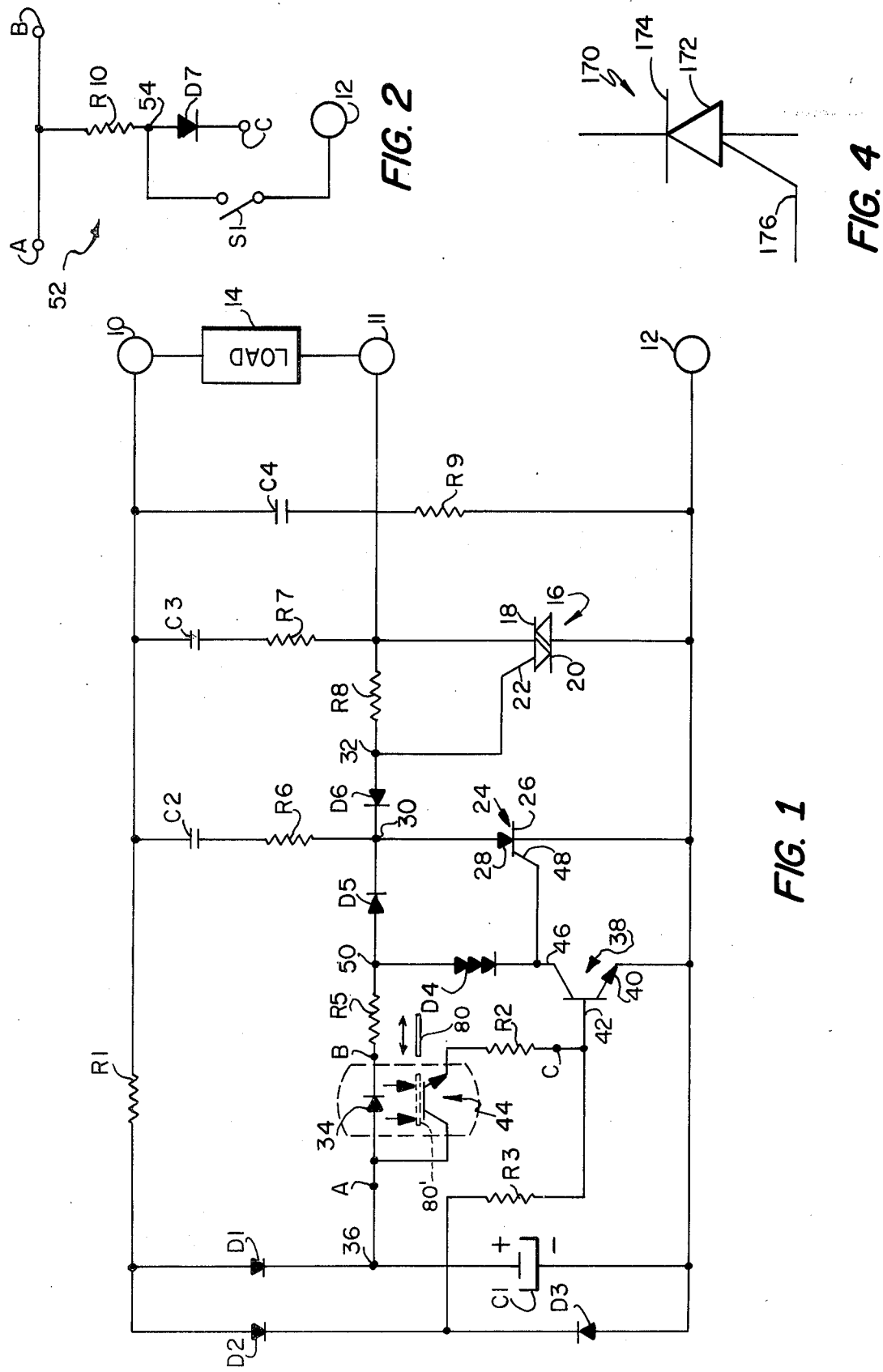

INTEGRAL CYCLE SWITCH SYNCHRONIZED TO AXIS-CROSSING

BACKGROUND OF THE INVENTION

This invention relates generally to a switching circuit and, more particularly, to a switching circuit which initiates and terminates current flow to an AC connected load at the time in the AC cycle when input voltage is at or near zero. That is, energization and de-energization of the load occurs in substantial synchronism with the axis crossing of the voltage waveform. Also, power is furnished only in complete, integral AC cycles.

It is known that activation and deactivation of an AC load at a time of substantial instantaneous line voltage can create annoying, as well as harmful, side effects in the power source and connected loads. Also, nearby sound, communication, data processing and video circuits can be adversely affected by transients introduced by switching. Additionally, interruption of power in mid-cycle may have harmful effects by exposing transformers and motors to rectified power, and magnetic components may retain an undesired residual magnetism.

U.S. Pat. No. 3,727,080 by Hanchett and U.S. Pat. No. 3,745,378 by Pritchett are examples of prior art circuits which provide so-called zero voltage switching with an integral power cycle. The latter circuit is quite complex, and the former patent appears to use substantial gate power during the first half cycle which may shorten the operational life of the elements. Additionally, Hanchett requires an externally supplied voltage signal to arm his circuit for load operation.

SUMMARY OF THE INVENTION

The switching circuit of this invention is comprised of a bidirectional, gate controlled, semi-conductor device, for example a triac, connected with the electrical load across an AC power source. The triac commences to conduct only after a unidirectional, gate controlled semiconductor device, for example, a silicon controlled rectifier, (SCR), is conducting. Conduction of the unidirectional, gate controlled rectifier drives the gate of the triac, enabling the triac for conduction. In turn, the enabling semiconductor, e.g., SCR, is controlled by a switching circuit which regulates the potential at the gate of the unidirectional, gated semiconductor. The switching circuit is responsive to an external switch device. The nature of the external switch device is not limited in type and may be manual, e.g., a single pole, single throw switch; and it may be, for example, in the nature of a photodetector and movable shutter in combination with a light-emitting diode (LED). Accordingly, operation of the external switch device causes power to be delivered to or removed from the load. When the load is turned on, load conduction always commences substantially when the source voltage crosses the reference axis in a selected direction. When the load is turned off, by operating the external switch device, load conduction always ceases at the completion of a full AC cycle as measured in relation to the time of initiation of load conduction. Stored energy in the circuit maintains the triac in conduction at the midpoint of its conducting cycle when the low source potential might otherwise cause the triac to cease conducting.

Accordingly, an object of the present invention is to provide a switching circuit which energizes and de-energizes the load in substantial synchronization with preferred axis crossings of the AC source voltage.

Another object of the present invention is to provide a switching circuit which interrupts load power only upon completion of an integral AC cycle.

Yet another object of the present invention is to provide a switching circuit which is enabled by an external switch device.

Still another object of the present invention is to provide a switching circuit which is operated by an external switch mechanism which is not an electrical part of the electrical circuit, e.g., a shutter controlling a light source.

Other objects, advantages and novel features of the present invention will become apparent from the following detailed description of the invention when considered in conjunction with the accompanying drawing in which:

FIG. 1 is a schematic diagram of the present invention for an integral cycle AC switching circuit synchronized to initiate load conduction on a positive-going axis crossing.

FIG. 2 is an alternative embodiment of the external switch device circuit of the invention of FIG. 1.

FIG. 4 is the schematic symbol of a reverse polarity silicon-controlled rectifier used with the circuit of FIG. 3.

DESCRIPTION OF THE INVENTION

Figure 3:
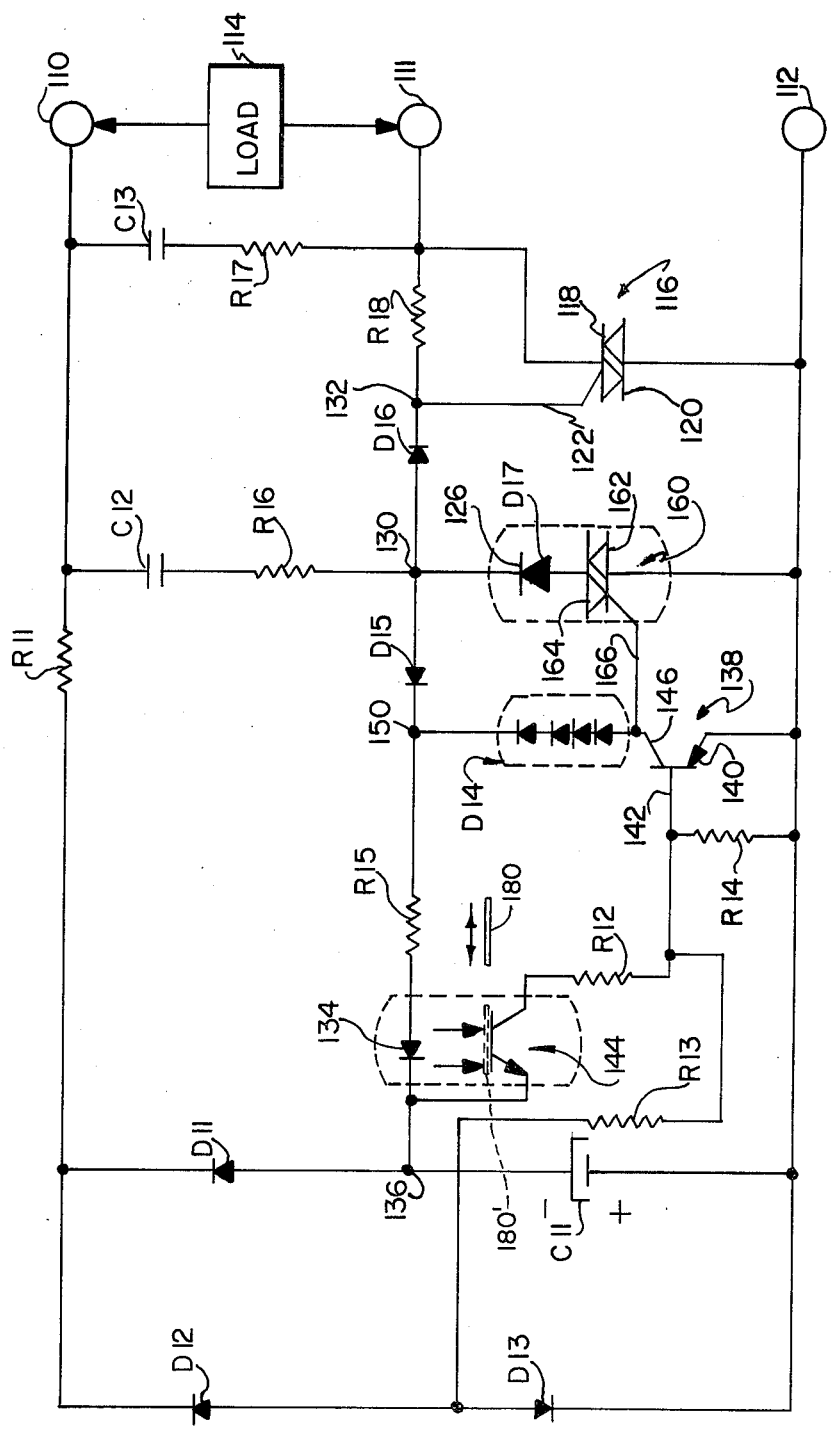
FIG. 3 is a schematic diagram of the present invention for an integral cycle AC switching circuit synchronized to initiate load conduction on a negative-going axis crossing.

With reference to FIG. 1, a pair of line terminals 10, 12 are provided for connection to an AC source of power. The electrical load 14, which is to be operated from the AC power source is connected with a triac 16 having two load terminals 18, 20 and a gate electrode 22. The load 14 is connected at one end to one AC line terminal 10 and at the other end to line terminal 11 which joins directly to the triac load terminal 18; the other triac load terminal 20 is connected to the other AC source terminal 12. The triac 16 is a well-known bidirectional semiconductor device which initiates conduction of current when a voltage differential of sufficient magnitude exists between its load terminals 18, 20 and simultaneously, the gate electrode 22 is above a threshold potential difference relative to triac terminal 18. If needed, U.S. Pat. No. 3,727,080 provides a further description of the triac and its operation as will suffice for this disclosure. Triac terminals 18 and 20 are designated as 'load' terminals herein because they carry the anode to cathode current, which also flows through the load 14, when the triac 16 is fired, as explained hereinafter.

A capacitor C3 is in series with resistor 37 across the load 14. A capacitor C2, a resistor R6, and a silicon-controlled rectifier (SCR) 24, in series are connected across the AC terminals 10, 12, with one end of capacitor C2 connected to terminal 10. The cathode 26 of the SCR 24 connects to the line terminal 12 and the anode 28 of the SCR 24 connects to resistor R6, such that the SCR 24 is oriented to carry conventional current to the AC terminal 12. A resistor R8 and a semiconductor diode D6, in series in that order, connect between the triac terminal 18 and the junction 30 between resistor R6 and the anode 28 of the SCR 24. The cathode of diode D6 connects to the junction 30, such that diode D6 is oriented to pass conventional current in the direction toward the SCR 24. The gate electrode 22 of the triac 16 is connected to the junction 32 between resistor R8 and diode D6.

Also connected across the AC terminals 10, 12 in series are resistor R1, semiconductor diode D1 and capacitor C1, in that order with one end of resistor R1 connected to AC terminal 10, and the anode of diode D1 connected to resistor R1. A pair of semiconductor diodes D2, D3 in series, and connected cathode to cathode, are connected in parallel with the series arrangement of diode D1 and capacitor C1. A light-emitting diode (LED) 34, a resistor R5, and semiconductor diode D5, in series connect between the junction 36 between diode D1 and capacitor C1 and the junction 30. The anode of the LED 34 connects to junction 36 and the cathode of diode D5 is connected to junction 30, permitting current flow toward the SCR 24.

A NPN transistor 38 is connected with its emitter 40 connected to the AC terminal 12, and its base 42 is connected through resistor R3 to the junction between diodes D2 and D3. The base 42 is also connected to the junction 36 through resistor R2 and a photoconductor 44 in series. The LED 34 and the photoconductor 44 are physically positioned such that light emitted by the LED 34 activates the photoconductor 44 making the photoconductor conductive. A movable shutter 80 is provided to physically obstruct the light path between the LED 34 and the photoconductor 44, thereby controlling current flow through the photoconductor as more fully explained hereinafter.

The collector 46 of the transistor 38 is connected to the gate 48 of the SCR 24. Also, the collector 46 of the transistor 38 is connected to the junction 50 between resistor R5 and diode D5 through a triple junction diode D4 having its cathode connected to the collector 46. When conducting, the impedance of diode D4 is substantially larger than the conducting impedance of diode D5. Capacitor C4 and resistor R9 in series are across the AC terminals 10, 12 and shunt high frequency electrical noise around the load 14.

Operation of the switching circuit of this invention is described hereinafter; first, for the condition wherein the load 14, although connected into the circuit at AC terminal 10 and triac terminal 18, is not powered on because the external switch device comprised of the photoconductor 44 and LED 34 is in the load-off condition. In this load-off condition, the light emitted by the LED 34 is received by the photoconductor 44 placing the photoconductor 44 in a conductive condition, that is, the movable shutter 80 is not obstructing the light from the LED 34.

On the positive half cycle of AC, when terminal 10 is positive with respect to terminal 12, a conventional AC current flows through resistor R1, diode D1 and capacitor C1 in series between the AC terminals 10, 12. (All currents described herein are conventional). Capacitor C1 charges up with its top terminal, connected to junction 36, positive with respect to its lower terminal. Additionally, on the positive half cycle, the NPN transistor 38 is biased to conduct; and current flows to the base 42 from the AC terminal 10 via resistor R1, diode D1, photoconductor 44 and resistor R2. Collector current flows through the resistor R1, diode D1, LED 34, resistor R5 and the triple junction diode D4.

The low voltage drop between collector 46 and emitter 40 of the conducting transistor 38, effectively clamps the gate 48 of the SCR 24 to the cathode 26 and prevents conduction of said SCR 24. With the SCR 24 being non-conductive, current flow to capacitor C2 and resistor R6 is prevented by the diodes D5 and D6. Current flow through resistor R7, and the load 14 and resistor R8 is prevented by diode D5 and the non-conducting SCR 24. The triac gate 22 remains unbiased and no load conduction is possible through the triac 16.

At the power axis crossing from positive to negative and in the immediately following negative half cycle, i.e., terminal 10 is negative with respect to terminal 12, the NPN transistor 38 continues to conduct. In this condition, the capacitor C1, which was charged on the preceding positive half cycle, acts as a DC power source and provides conductive biasing for the transistor 38. The path of discharge of the capacitor C1 if from its upper positive terminal 36, through the LED 34, resistor R5 and diode D4 to the transistor collector 46. Base current flows from capacitor terminal 36, through the photoconductor 44 and resistor R2. The time constant of the discharge path of capacitor C1 and resistor R5 in relation to the AC source frequency is such that capacitor C1, charged each cycle, always retains a positive polarity at junction 36. Thus, while light from the LED 34 reaches the photoconductor 44, the NPN transistor 38 remains conductive on both positive and negative half cycles. As stated above, conduction of said transistor 38 prevents conduction of the SCR 24, which in turn prevents conduction through the triac 16 and the load 14.

When it is desired to power the load 14, the external switch device, i.e., LED 34 in conjunction with the photoconductor 44, is put into the load-on condition by intercepting the light path between the LED 34 and photoconductor 44 with the mechanical shutter 80'. The photoconductor 44 is non-conducting when incident light is absent.

In this load-on mode, the NPN transistor 38 conducts during the first positive half cycle after the external switch is activated. Although the photoconductor 44 is not conducting, base current flows into the NPN transistor 38 from the AC source terminal 10, through resistor R1, diode D2 and resistor R3. Capacitor C1 charges and the SCR 24 is prevented from conduction with its gate 48 clamped to its cathode 26 as described above.

On the immediately following negative half cycle, the transistor 38 is cut off because base current is unavailable either through the photoconductor 44 or via resistor R3. The SCR gate 48 is no longer clamped to the SCR cathode 26. The stored charge in capacitor C1, positive at terminal 36, drives the SCR gate 48 and initiates conduction of the SCR 24. Thereby, a current path is provided for discharging of capacitor C1 through the LED 34, resistor R5, as stated above, and diode D5 in series with the SCR 24. Current to the SCR gate 48, through the multi-junction diode D4 is low because of the substantially lower impedance parallel path for current flow through conventional diode D5. During the negative half cycle, the capacitor C2 acquires a charge from current flowing from the AC terminal 12, through capacitor C1, the LED 34, resistor R5, diode D5 and resistor R6 in series. The voltage on capacitor C2 is negative at the terminal 10.

The triac 16 remains non-conducting during this first negative half cycle because the triac gate 22 is isolated by the current opposing diode D6. As the AC signal passes the negative to positive axis crossing, the transistor 38 is ready to resume conduction substantially at the zero crossing. The triple junction diode D4, having a high impedance relative to diode D5 as aforesaid, prevents the renewed conduction of transistor 38 from starving the anode 28 of the SCR 24, which continues to flow discharge current from capacitor C1 at the zero crossing and into the ensuing positive half cycle where the rise in positive potential at terminal 10 maintains the SCR in conduction. In the known manner, the SCR 24, once fired, is not controlled by the voltage on its gate 48. While both the SCR 24 and the transistor 38 are conductive, in the positive half cycle, the voltage at junction 50 remains low relative to the emitter, such that collector current in the transistor 38 is low.

With the SCR 24 conducting, as terminal 10 goes positive, a current flows from said terminal 10 through the load 14, through resistor R8, diode D6 and the SCR 24, in order, to the other AC terminal 12. In this condition, voltage differentials exist across the triac gate 22 and terminals 18, 20; the gate 22 is driven; and the triac 16 fires. The triac 16 and the load 14 then are a conductive loop across the AC line terminals 10, 12. In the known manner, the triac 16 latches into an ON state if there is sufficient load current to satisfy the minimum latching-current requirement of the triac 16. The triac 16 and load 14 then remain ON through the positive voltage half cycle. Capacitor C2 in series with resistor R6 and the SCR 24 is also a conductive path across the AC terminals 10, 12 when the SCR 24 conducts; and during the positive half cycle, the capacitor C2 charges with a positive polarity at its connection to AC terminal 10. As in RC networks, the voltage across capacitor C2 lags behind the source potential. After the positive voltage peak on capacitor C2 is passed, said capacitor C2 follows the AC source by discharging from its positive terminal 10 through the load 14, resistor R8, diode D6 and resistor R6. Resistor R8 is sized to maintain a low gate impedance on the triac 16 and minimize false triggering thereof. Because of the aforesaid voltage lag and the time constant of the discharge path of capacitor C2, when the terminal 18 of the triac 16 passes through zero voltage to initiate the negative half cycle, or when the load current drops to zero which occurs later with an inductive load 14, the energy stored in the capacitor C2 continues to discharge. This discharge flow of capacitor C2 retriggers the gate 22 of the triac 16 and the triac 16 continues to be conductive for the negative half cycle of AC.

Thus, because of capacitor C2, once fired (with the light path interrupted) for the positive half cycle, the triac 16 continues conduction of load current through the negative half cycle, and continuously for additional integral cycles while the light path remains interrupted. Similarly, the SCR 24, once fired on the negative half cycle, remains in conduction for the ensuing positive half cycle, as described above, and continuously for additional cycles while the light path remains interrupted. When the light path is renewed, the transistor 38 conducts and the SCR 24 is extinguished during the negative half cycle. Thus, the triac 16 is not triggered for the ensuing positive half cycle and the chain of integral cycles is broken.

To summarize, positive half cycle conduction of the triac 16 is triggered for each cycle by conduction through the SCR 24, and conduction through the triac 16 is always maintained for the following negative half cycle by the action of capacitor C2. Thus, only integral cycles of load conduction are produced, always commencing substantially at the axis crossing from negative to positive of the AC source voltage. More precisely, load conduction continues until the instantaneous value of the load current drops below the latching level of the triac.

Capacitor C3 and resistor R7, in series, are across the load 14 to counter the effects of inductive loads. Otherwise, the lagging current of an inductive load might be inadequate in the positive half cycle to cause the desired early latching of the triac 16 substantially at the axis crossing.

It should be understood that the external switch device represented by the LED 34, photoconductor 44 and adjustable shutter device 80 of FIG. 1 is not the exclusive arrangement suited to accomplish control over conduction through the load 14. In the circuit of FIG. 1, the external switch device (shutter 80) operates to interrupt current flow to the transistor base 42 during the negative half cycle so that the load 14 is powered ON at the next positive half cycle as described above. Any external switch arrangement which diverts or prevents flow to the transistor base 42 during the negative half cycle will serve. For example, FIG. 2 illustrates an alternative embodiment for an external switch network 52, which may be used with the circuit of FIG. 1. The switch network 52 includes resistor R10 in series with diode D7, and single pole switch S1 connected between AC terminal 12 and the common junction 54 of resistor R10 and the anode of diode D7. When applied to the circuit of FIG. 1, the network 52 replaces the LED 34, the photoconductor 44 and resistor R2, and connects the terminals A, B and C of FIG. 2 to the corresponding terminals A, B and C of FIG. 1.

When the switch S1 is open, base current flows through resistor R10 and diode D7 during the negative half cycle to maintain conduction of the transistor 38. Thus, the circuit operates as described above, i.e., the transistor conducts for the entire AC cycle and prevents firing of the SCR 24. When the switch S1 is closed, the current on the negative half cycle through resistor R10 bypasses the transistor base 42 and flows directly through the switch S1 to AC terminal 12. With base current diverted, the transistor 38 is non-conductive during the negative half cycle and the SCR 24 will fire. In other respects, the circuit of FIG. 1 using the external switch network 52 of FIG. 2 performs in a manner as described above.

An alternative embodiment (FIG. 3) of the switching circuit of this invention provides the switching on of a load substantially in synchronism with the axis crossing of the source voltage from a positive voltage into the negative half cycle. As in the embodiments described above, an integral cycle of power is provided when the load is switched off.

With reference to FIG. 3, a pair of line terminals 110, 112 are provided for connection to an AC source of power. The load 114, which is to be operated from the AC power source is connected with a triac 116 having two terminals 118, 120 and a gate electrode 122. The load is connected at one end to one AC source terminal 110 and at the other end to line terminal 111 which joins directly to the triac terminal 118; the other triac terminal 120 is connected to the other AC source terminal 112.

A capacitor C13 in series with resistor R17 is across the load 114. A capacitor C12, a resistor R16, a diode D17 and another triac 160, in series, are connected across the AC terminals 110, 112, with one end of capacitor C12 connected to terminal 110. One terminal 162 of the triac 160 connects to the line terminal 112 and the cathode 126 of the diode D17 connects to resistor R16, such that the triac 160 in series with the diode D17, is oriented to carry conventional current from the AC terminal 112. A resistor R18 and a semiconductor diode D16, in series in that order, connect between the triac terminal 118 and the junction 130 between resistor R16 and the cathode 126 of the diode D17. The anode of diode D16 connects to the junction 130, such that diode D16 is oriented to pass conventional current in the direction away from the diode D17. The gate electrode 122 of the triac 116 is connected to the junction 132 between resistor R18 and diode D16.

Also connected across the AC terminals 110, 112, in series, are resistor R11, semiconductor diode D11 and capacitor C11, in that order, with one end of resistor R11 connected to AC terminal 110, and the cathode of diode D11 connected to resistor R11. A pair of semiconductor diodes D12, D13 in series, and connected anode to anode, are connected in parallel with the series arrangement of diode D11 and capacitor C11. A light-emitting diode (LED) 134, a resistor R15, and semiconductor diode D15, in series, connect between the junction 136 between diode D11 and capacitor C11 and the junction 130. The cathode of the LED 134 connects to junction 136 and the anode of diode D15 is connected to junction 130.

A PNP transistor 138 is connected with its emitter 140 connected to the AC terminal 112, and its base 142 is connected to the junction between diodes D12 and D13 through resistor R13. The base 142 is also connected to the junction 136 through resistor R12 and a photoconductor 144 in series. Resistance R14 connects between the base 142 and the source terminal 112 and biases the transistor 138. The LED 134 and the photoconductor 144 are physically positioned such that light emitted by the LED 134 activates the photoconductor 144 making the photoconductor conductive. A movable shutter 180 is provided to physically obstruct the light path between the LED 134 and the photoconductor 144, thereby controlling current flow through the photoconductor as more fully explained hereinafter.

The collector 146 of the transistor 138 is connected to the gate 166 of the triac 160. Also, the collector 146 of the transistor 138 is connected to the junction 150 between resistor R15 and diode D15 through a multi-junction diode D14 having its anode connected to the collector 146. When conducting, the impedance of multi-junction diode D14 is substantially larger than the conducting impedance of diode D15.

The operation of the circuit of FIG. 3 is similar to the operation, described above, for the embodiment of FIG. 1, except that conduction of power to the load can begin only during a negative half cycle. Integral cycles are provided thereafter. This reversed performance characteristic in the circuit of FIG. 3 results from a reversal in orientation of all diodes and the photoconductor and from the use of a PNP transistor rather than an NPN transistor. Also, the series combination of the triac 160 and diode D17 provides a unidirectional-gated device equivalent to an SCR but which has a reversed current carrying orientation as compared to the SCR 24 of FIG. 1.

In the load-off condition (FIG. 3), the light emitted by the LED 134 is received by the photoconductor 144 placing it in a conductive condition. On the negative half cycle of AC, when terminal 112 is positive with respect to terminal 110, a conventional AC current flowing from terminal 112 passes through resistor R11, diode D11 and capacitor C11 in series across the AC terminals 110, 112. (All currents described herein are conventional). Capacitor C11 charges up with its top terminal, connected to junction 136, negative with respect to its lower terminal. Additionally, on the negative half cycle, the PNP transistor 138 is biased to conduct; and current flows from the AC terminal 112 via the base 142, resistor R12, photoconductor 144, diode D11, and resistor R11 to the terminal 110. Collector current flows through the LED 134, resistor R15 and the multiple junction diode D14.

The low voltage drop between collector 146 and emitter 140 of the conducting transistor 138, effectively clamps the gate 166 of the triac 160 to its terminal 162 and prevents initial conduction of said triac 160. With the triac 160 being non-conductive, current flow to capacitor C12 and resistor R16 is prevented by the diodes D15 and D16. Current flow through resistors R17 and the load 114 and resistor R8 is prevented by diode D15 and the non-conducting triac 160.

Further operation of the circuit (FIG. 3) is analagous to that of the circuit of FIG. 1 and, therefore, a complete description is not presented here. Nevertheless, it is worth noting that capacitor C11 provides the voltage and current source which maintains transistor conduction when the AC source is in the positive half cycle and the light path is not interrupted. When the light path is first interrupted, that is, when the shutter 180 is moved to the position identified as 180' between the LED 134 and the photoconductor 144 the transistor 138 cuts off upon the occurrence thereafter of the first positive half cycle. This transistor cut off causes the unidirectional triac 160/diode D17 combination to fire and, in a manner analagous to the operation of FIG. 1, the bidirectional triac 116 is fired and conduction through the load 114 commences substantially simultaneously with the axis crossing of the AC source voltage into the following negative half cycle. Discharge of the capacitor C12 maintains conduction of the fired triac 116 at the mid-cycle negative to positive axis crossing and assures integral cycle operation.

In another alternative embodiment of this invention, the combination of triac 160 and diode D17 in series of FIG. 3 may be replaced by a reverse polarity silicon-controlled rectifier 170 as shown symbolically in FIG. 4. When used in the place of the diode D17 and triac 160 combination of FIG. 3, the anode 172 of the reverse polarity silicon-controlled rectifier 170 connects to line terminal 112, the cathode 174 connects to the junction 130, and the gate electrode 176 connects to the collector 146 of the PNP transistor 138. A forward biasing of the anode 172 relative to the cathode 174, concurrently with the gate 176 being negative relative to the anode 172 brings the reverse polarity silicon-controlled rectifier into conduction.

A three-junction diode D14 has operated satisfactorily when a reverse polarity silicon-controlled rectifier 170 is used in the circuit. When the triac/diode combination (160/D17) is used, four junction and five junction diodes D14 have performed satisfactorily.

It will also be apparent that the light source need not be a LED; other light sources may be used. Also, the light source may be powered externally of the circuits of FIGS. 1 and 3 and still operate upon the photoconductor as described above. Any other means, which cause synchronized interruption of transistor base current in response to an external switch may also be considered to be in the spirit of this invention.

What is claimed:

1. A switching circuit for initiating and terminating current flow to an AC-connected load, said current initiation occuring substantially in synchronism with the axis crossing of an AC power source to a preferred voltage polarity from the opposite voltage polarity comprising:

first and second AC line terminals connected to said AC power source, a controlled bidirectional gate device having first and second load terminals, means for connecting said load at one end with the second load terminal, means for connecting the other end of said load to the first of said AC line terminals, the first load terminal of said controlled bidirectional gate device being connected to the second of said AC line terminals.

said bidirectional gate device initiating current flow in said load when a voltage potential exists between said first and second load terminals and concurrently a voltage potential exists between the gate electrode of said bidirectional gate device and said second load terminal, the direction of said load current reversing substantially as the polarity of voltage across said AC line terminals reverses;

a first network across said AC power source terminals including a controlled unidirectional gate device, said unidirectional gate device having first and second terminals and a gate electrode, said unidirectional gate device initiating current flow through said first network when said first and second terminals of said unidirectional gate device are forward biased and when concurrently said gate electrode is triggered by a voltage differential with respect to said second terminal of said unidirectional gate device;

circuit means for triggering said unidirectional gate device into conduction, said triggering occurring only when said source voltage is of said opposite polarity;

circuit means for triggering said bidirectional gate device into conduction, only when said unidirectional gate device is conducting, said triggering of said bidirectional gate device occuring substantially when said source voltage crosses into said preferred polarity.

2. The switching circuit of claim 1 further comprising means for turning off said bidirectional gate device only upon substantial completion of an integral cycle of said AC source voltage, whereby current to said load is terminated substantially at the completion of said integral cycle.

3. The switching circuit of claim 1 wherein said circuit means for triggering said unidirectional gate device into conduction include a transistor, said transistor when conducting substantially clamping said gate electrode of said unidirectional gate device to said second terminal of said unidirectional gate device whereby triggering of said unidirectional gate device is prevented; said transistor, when not conducting, unclamping said gate electrode and said second terminal whereby said unidirectional gate device is triggered into conduction.

4. The switching circuit of claim 3 wherein said circuit means for triggering said unidirectional gate device into conduction further includes means for causing said transistor to conduct during the entire half cycle of said preferred polarity of said AC power source.

5. The switching circuit of claim 4 wherein said circuit means for triggering said unidirectional gate device into conduction further includes an external switching device, said external switching device when in a first state causing said transistor to conduct during the half cycle of said opposite polarity of said AC power source whereby said unidirectional gate device is not triggered during a cycle of said power source; and in the alternative, said switching device when in a second state causing said transistor to be non-conductive during the half cycle of said opposite polarity of said AC power source whereby said unidirectional gate device is triggered during said half cycle of said opposite polarity of said AC power source, and said bidirectional gate device is triggered substantially synchronized to the axis crossing of said source voltage into said preferred polarity.

6. The switching circuit of claim 5 further comprising a second network including a first resistor and first capacitor, said first capacitor charging to a voltage of said preferred polarity when said AC source voltage is in a half cycle of said preferred polarity, said first capacitor partially discharging through said first resistor and said transistor during the half cycle of said opposite polarity of said source voltage when said external switching device is in said first state, whereby said transistor conducts and said unidirectional gate device is not triggered during both halves of an integral cycle of said source voltage.

7. The switching circuit of claim 6 wherein said second network further includes first and second circuit branches, said first circuit branch carrying said discharge current from said first capacitor to said transistor when said transistor conducts, said second circuit branch carrying said discharge current to said unidirectional gate device when said external switch is in said second state and said unidirectional gate device conducts, said first circuit branch having a substantially greater impedance to current flow than said second circuit branch whereby said second circuit branch carries the greater portion of said discharge current when both said transistor and said unidirectional gate device conduct simultaneously.

8. The switching circuit of claim 7, said circuit means for triggering said bidirectional gate device into conduction further comprising a diode and second resistor in series between said bidirectional and unidirectional gate devices, said gate electrode of said bidirectional gate device connected between said diode and said second resistor, the other end of said second resistor being connected to said second load terminal of said bidirectional gate device, whereby current flowing through said circuit means for triggering said bidirectional gate device into conduction and said unidirectional gate device triggers said bidirectional gate device into conduction, said diode oriented to conduct when said source voltage is in said preferred polarity.

9. The switching circuit of claim 8 wherein said first network further includes a second capacitor and a third resistor in series, said second capacitor and third resistor in series at one end connected to said first terminal of said unidirectional gate device, said second capacitor and third resistor in series connected at the other end to said first AC line terminal, said second capacitor charging through said unidirectional gate device when said unidirectional gate device is conducting and said source voltage is of said preferred polarity, said second capacitor discharging through said circuit means for triggering said bidirectional gate device into conduction to retrigger said bidirectional gate device into reversed conduction when said AC source voltage changes at mid-cycle to said opposite polarity.

10. The switching circuit of claim 2, wherein said first network further includes a capacitor and a resistor in series, said capacitor and resistor in series at one end connected to said first terminal of said unidirectional gate device, said capacitor and resistor in series connected at the other end to said first AC line terminal, said capacitor charging through said undirectional gate device when said unidirectional gate device is conducting and said source voltage is of said preferred polarity, said capacitor discharging to retrigger said bidirectional gate device into reversed conduction when said source voltage changes at mid-cycle to said opposite polarity.

11. The switching circuit of claim 9 wherein said bidirectional device is a triac.

12. The switching circuit of claim 11, wherein said unidirectional gate device is a silicon controlled rectifier (SCR), said transistor is of the NPN type, the impedance of said first circuit branch to carry current to said transistor being a three-junction diode, the impedance of said second circuit branch to carry current to said SCR is a single junction diode, and said preferred polarity has said first of said AC line terminals positive relative to said second of said AC line terminals.

13. The switching circuit of claim 11 wherein said unidirectional gate device is the combination of a triac in series with a diode, said transistor is of the PNP type, the impedance of said first circuit branch to carry current from said transistor being at least a four junction diode, the impedance of said second circuit branch to carry current from said unidirectional gate device is a single junction diode, and said preferred polarity has said first of said AC line terminals negative relative to said second of said AC line terminals.

14. The switching circuit of claim 13 wheren said unidirectional gate device is a reverse polarity SCR.

15. The switching circuit of claim 9 wherein said external switching device includes a movable mechanical shutter located to intercept a light path from a light source, said light when unintercepted impinging upon a photoconductor in circuit with the base terminal of said transistor, whereby said circuit to said base terminal is conductive when light impinges on said photoconductor and nonconductive when said light is intercepted by said shutter, said conductive condition being said first state and said nonconductive condition being said second state of said external switching device.

16. The external switching device of claim 15 wherein said light source is a light emitting diode (LED).

17. The external switching device of claim 15 wherein said light source is a component of said switching circuit, said light source being energized when said switching circuit is connected to said AC power source.

18. The switching circuit of claim 9 wherein said external switching device includes a single pole switch, said switch when closed substantially clamping together the base and emitter terminals of said transistor whereby said transistor is non-conductive when said switch is closed and said AC source is in said opposite polarity.

19. The switching circuit of claim 2 further comprising a phase shifting network across said load.

20. The switching circuit of claim 19 wherein said phase shifting network includes a resistor and capacitor in series.

21. The switching circuit of claim 2 further comprising an electrical noise filter network across said AC source terminals.

22. A switching circuit for initiating and terminating current flow and providing integral cycles to an AC-connected load, said current initiation occurring substantially in synchronism with the axis cross of an AC power source to a positive voltage polarity from a negative voltage polarity comprising:

first and second AC line terminals connected to said AC power source; a triac having first and second load terminals and a gate electrode, means for connecting said load at one end with said second load terminal of said triac; means for connecting the other end of said load to said first AC line terminal, the first load terminal of said triac being connected to said second AC line terminal, the polarity of said AC source being indicative of the voltage at said first AC line terminal relative to said second AC line terminal; a series interconnected first capacitor and first resistor across said load; a series connected second capacitor, second resistor, and silicon-controlled rectifier (SCR) across said AC line terminals, one end of said second capacitor connected to said first AC line terminal, the cathode of said SCR connected to said second AC line terminal; a third resistor and a first diode, in series in that order, connected between said second load terminal and said anode of said SCR, the cathode of said first diode connected to said anode of said SCR, said gate electrode of said triac being connected between said third resistor and said first diode; a fourth resistor, a second diode and third capacitor, interconnected in that order between said first and second AC line terminals, the anode of said second didode connected to said fourth resistor; a third and fourth diode, interconnected in series cathode to cathode, said third and fourth diode connected in parallel with said second diode and said third capacitor; a series connected light-emitting diode (LED), fifth resistor, and fifth diode between the cathode of said second diode and the anode of said SCR, the anode of said LED connected to said second diode and the cathode of said fifth diode connected to said anode of said SCR; a NPN transistor having its emitter connected to said second AC terminal, its base connected through a sixth resistor to said cathode of said third diode and said base further connected through a series connected seventh resistor and photoconductor to the anode of said LED; said LED and said photoconductor positioned such that light emitted by said LED can activate said photoconductor; the collector of said transistor connected to said gate of said SCR, said collector further connected to the cathode of a triple junction diode, the anode of said triple junction diode connected to the anode of said fifth diode, the conducting impedance of said triple junction diode being larger than the conducting impedance of said fifth diode; and a movable shutter able to physically obstruct the light path between said LED and said photoconductor.

23. A switching circuit for initiating and terminating current flow and providing integral cycles to an AC-connected load, said current initiation occurring substantially in synchronism with the axis crossing of an AC power source to a negative voltage polarity from a positive voltage polarity comprising:

first and second AC line terminals connected to said AC power source; a triac having first and second load terminals and a gate electrode, means for connecting said load at one end with said second load terminal of said triac; means for connecting the other end of said load to said first AC line terminal, said first load terminal of said triac being connected to said second AC line terminal, the polarity of said AC source being indicative of the voltage at said first AC line terminal relative to said second AC line terminal;

a series interconnected first capacitor first resistor, across said load; a second capacitor, second resistor, and unidirectional gate device connected in series across said AC line terminals, one end of said second capacitor connected to said first AC line terminal, said unidirectional gate device oriented to carry conventional current from said second AC terminal; a third resistor and a first diode, in series in that order, connected between said second load terminal and a junction between said second resistor and said unidirectional gate device, the anode of said first diode connected to said junction, said gate electrode of said triac being connected between said third resistor and said first diode; a fourth resistor, a second diode and a third capacitor, interconnected in that order, between said first and second AC line terminals, the cathode of said second diode connected to said fourth resistor; third and fourth diodes, interconnected in series anode to anode, said third and fourth diodes connected in parallel with said second diode and said third capacitor; a series connected light-emitting diode (LED), fifth resistor, and fifth diode between the anode of said second diode and the anode of said first diode, the cathode of said LED connected to said second diode and the anode of said fifth diode connected to said first diode; a PNP transistor having its emitter connected to said second AC terminal, its base connected to the anode of said third diode through a sixth resistor, said base further connected through a series interconnected seventh resistor and photoconductor to the cathode of said LED; an eighth resistor connected between said base and said second AC terminal, said LED and said photoconductor positioned such that light emitted by said LED can activate said photoconductor; the collector of said transistor connected to the gate of said unidirectional gate device, said collector further connected to the anode of a multi-junction diode, the cathode of said multi-junction diode connected to the cathode of said fifth diode, the conducting impedance of said multi-junction diode being substantially larger than the conducting impedance of said fifth diode; and a movable shutter able to physically obstruct the light path between said LED and said photoconductor.

24. The switching circuit of claim 23 wherein said unidirectional gate device is a reverse polarity SCR, and said multi-junction diode has three junctions.

25. The switching circuit of claim 23 wherein said unidirectional gate device is a second triac in series with a sixth diode, the cathode of said sixth diode connected to the anode of said first diode, the gate of said second triac substantially clamped to said transistor emitter when said transistor conducts, and said multi-junction diode has four junctions.

* * * * *